United States Patent [19]
Nishikawa

[11] Patent Number: 6,151,063
[45] Date of Patent: *Nov. 21, 2000

[54] PRINTED CIRCUIT BOARD INSPECTION APPARATUS AND METHOD

[75] Inventor: Hideo Nishikawa, Kyoto, Japan

[73] Assignee: Nidec Read Corporation, Kyoto, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/919,662

[22] Filed: Aug. 28, 1997

[30] Foreign Application Priority Data

Aug. 29, 1996 [JP] Japan ................................. 8-228270

[51] Int. Cl.[7] ...................................................... H04N 7/18
[52] U.S. Cl. ............................... 348/92; 348/95; 348/94; 348/86; 348/87
[58] Field of Search ................................. 348/95, 92, 94, 348/86, 87; 382/145; 324/500, 758

[56] References Cited

U.S. PATENT DOCUMENTS

| | | | |
|---|---|---|---|
| 4,357,575 | 11/1982 | Uren et al. ................................. | 324/758 |
| 4,571,542 | 2/1986 | Arai ......................................... | 324/537 |
| 4,820,975 | 4/1989 | Diggle ..................................... | 324/758 |
| 5,206,820 | 4/1993 | Ammann et al. ........................ | 702/185 |
| 5,537,050 | 7/1996 | Haruta et al. ........................... | 324/757 |
| 5,742,701 | 4/1998 | Takano et al. .......................... | 382/141 |

OTHER PUBLICATIONS

Prior Art Report by Hideo Nishikawa, Unpublished, Included with application; Nov. 27, 1997.

*Primary Examiner*—Andy Rao
*Attorney, Agent, or Firm*—McCormick, Paulding & Huber LLP

[57] ABSTRACT

A printed circuit board inspection apparatus having upper and lower jigs with the former moveable horizontally and the latter movable vertically and with a camera mounted on the former. Reference holes are provided on the upper jig and on a positioning plate mounted on the lower jig and, in accordance with the method of the invention, photographs are taken of the reference marks simultaneously with the positioning plate engaging the upper jig. Reference mark alignment is calculated from the photographs and the upper jig is moved horizontally to correct misalignment.

10 Claims, 8 Drawing Sheets

PRINTED CIRCUIT BOARD INSPECTION APPARATUS AND METHOD

FIELD OF THE INVENTION

The present invention relates generally to printed circuit boards, and more particularly, to an apparatus and method employed in the inspection of printed circuit boards.

BACKGROUND OF THE INVENTION

A conventional printed circuit board inspection apparatus comprises an upper inspection jig and a lower inspection jig. The lower inspection jig has guide posts and a circuit board to be inspected is located on the guide posts. The lower inspection jig is positioned by a lifting device in one and an opposite direction toward and away from the upper jig. The upper inspection jig has an X-Y-Ø drive device, and may include a universal jig, and a rubber jig. The X-Y-Ø drive device changes the relative horizontal positions of the upper and lower inspection jigs in accordance with the following method.

A pattern film used when a circuit board was manufactured is adhered temporarily to a rubber jig by an operator. A double coated adhesive tape is adhered to the surface of the inspected circuit board and the lifting device moves the lower inspection jig upwardly toward the upper jig to adhere the pattern film to the circuit board to be inspected. The operator observes any misalignment between the pattern film and the printed board, and then employs the X-Y-Ø drive device to fine-adjust the horizontal position of the upper inspection jig as required to correct the misalignment.

The foregoing operation is repeated in a trial-and-error fashion to determine relative positions of the upper and lower inspection jigs. Positioning is made in the abutting state, i.e., under the same conditions as those where the conductivity of the circuit board is inspected. This method, however, is complicated, time consuming and tedious.

To avoid this complication, it is possible to adjust the position of the upper inspection jig with the aid of a camera inserted and removed from between the jigs of the apparatus. This method, however, requires that fine positioning be made with the upper and the lower jigs separated from each other, resulting in misalignment when they are engaged.

One object of the present invention is to provide a printed circuit board inspection apparatus which can simply and accurately position an upper inspection jig.

Another object of the present invention is to provide a printed circuit board inspection apparatus in which the relative positions of an upper jig and a printed circuit board on a lower jig can be measured with the circuit board in contact with the upper jig.

SUMMARY OF THE INVENTION

In fulfillment of the foregoing objects, a printed circuit board inspection apparatus is provided with upper and lower jigs and a positioning plate. The positioning plate is set at a location where the printed circuit board is to be set, and the plate has at least one, preferably two or more, reference marks located at specified distances from an inspection region and in a specified direction, the region being defined by a plurality of guides or guide means for supporting the circuit board and positioning plate. Upper jig reference marks are provided for alignment with the positioning plate reference marks. Drive means move the upper or lower jig relative to the other until the upper jig and the positioning plate are brought into engagement. An image forming means in the form of a camera photographs the upper-jig reference marks and the positioning plate reference marks simultaneously and preferably from the upper jig side. A comparison and calculation means determines the amount of horizontal misalignment between the positioning plate and the upper jig based on the images taken with the positioning plate engaging the jig. Horizontal positioning means then adjusts the relative position of the lower and upper jigs based on the results of the calculation.

From the foregoing, it will be apparent that the upper inspection jig can be accurately positioned relative to an inspection region on the lower jig with the image forming means disposed outside of the upper jig electrode region. In addition, positioning can be executed with the upper jig in substantial engagement with the positioning plate to avoid misalignment. Thus, the upper jig can be simply and accurately positioned relative to a printed circuit board to be inspected.

In the inspection apparatus according to one aspect of the present invention, the upper jig reference marks are through holes, and the surface of the positioning plate is made of a highly reflective material. The positioning plate reference marks are preferably also through holes, but with somewhat smaller diameters than those of the through holes of the upper jig. Clear binary images can thus be obtained and used to determine the amount or degree of misalignment between the upper-jig reference marks and the positioning plate reference marks while the upper jig engages the positioning plate. The positioning plate can be simply made by using a material similar to that of the circuit board to be inspected and forming the positioning hole at a specified distance and in a specified direction from an inspection region.

In the printed circuit board inspection apparatus with an upper-jig positioning mechanism according to another aspect of the present invention, the upper jig comprises a universal jig and a pitch conversion board with an electrically conductive rubber portion, the upper-jig reference marks being formed on the pitch conversion board. Thus, a universal upper jig can be positioned accurately relative to an inspection region.

In one upper-jig positioning method according to the present invention, a positioning plate is supported on a lower-jig and is provided with at least one and prefereably a plurality of marks in specified directions and at specified distances from an inspection region. Upper-jig reference marks are formed at positions to be aligned with the positioning plate reference marks, and the image forming means for photographing upper-jig reference marks from the upper-jig side is mounted on the upper jig. Pictures of upper-jig reference marks and positioning plate reference marks are taken simultaneously while the upper jig engages the positioning plate. Based on the images of the marks thus obtained, misalignment between the positioning plate and upper jig is calculated and the relative position of the lower and the upper jigs is adjusted.

The method enables the upper inspection jig to be positioned accurately relative to the inspection region. In addition, positioning can be executed with the jig substantially engaging the positioning plate to avoid misalignment during the operation. Thus, the upper jig can be simply and accurately positioned relative to the printed circuit board to be inspected.

In an upper-jig positioning method according to a still further aspect of the present invention, pattern reference marks are formed beforehand in a creation film with a pattern formed in a conductive rubber portion so that the pattern reference marks are specifically related to the pattern. The creation film is positioned so that the film aligns with the pattern of the conductive rubber portion. The pattern reference marks and the upper-jig reference marks are employed to measure the amount of any pattern misalignment between them. Thus, correction is obtained by considering the amount of pattern misalignment between the conductive rubber portion of the conversion board and the conversion board. This method insures simple and accurate positioning even if the conductive rubber portion is misaligned relative to the conversion board.

BRIEF DESCRIPTION OF PREFERRED EMBODIMENTS

Figure 1:
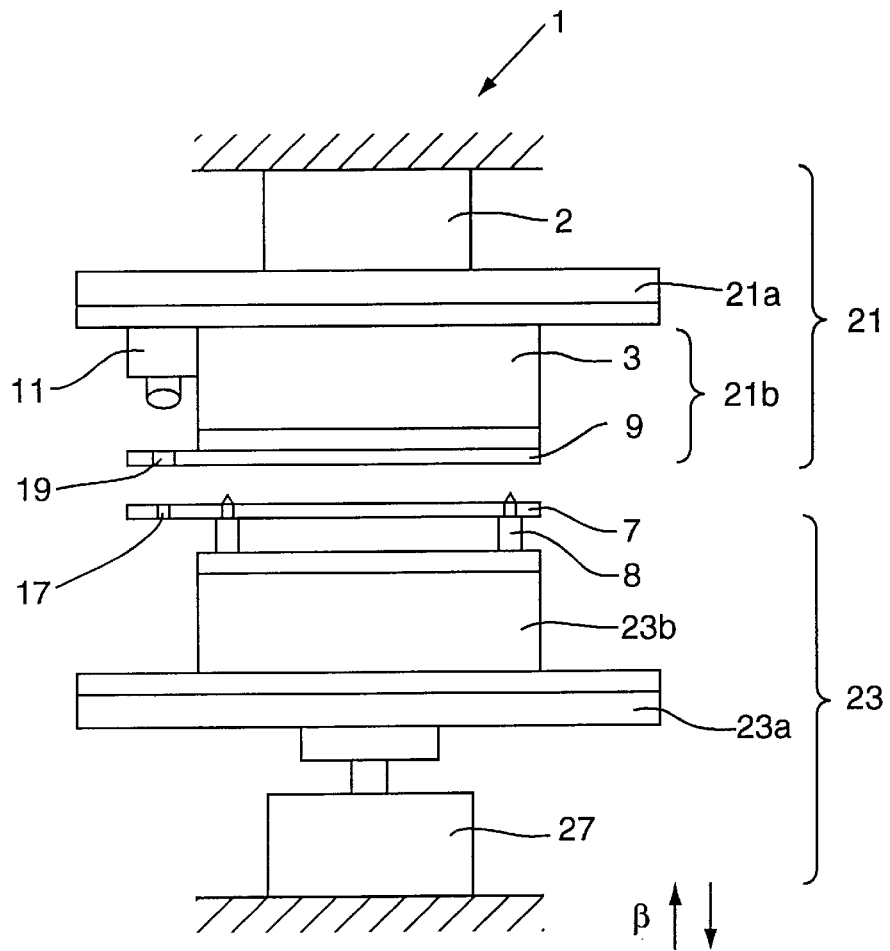
FIG. 1 shows the overall configuration of a printed circuit board inspection apparatus in accordance with the present invention.

With reference to the drawings, FIG. 1 is a schematic diagram of a printed circuit board inspection apparatus 1 with an upper inspection jig 21 and a lower inspection jig 23. The upper inspection jig 21 includes an X-Y-Ø drive device 2, an upper base plate 21a, two cameras 11, and an upper inspection section 21b. The upper inspection section 21b includes a universal jig 3 and a pitch conversion board 9.

Figure 3:
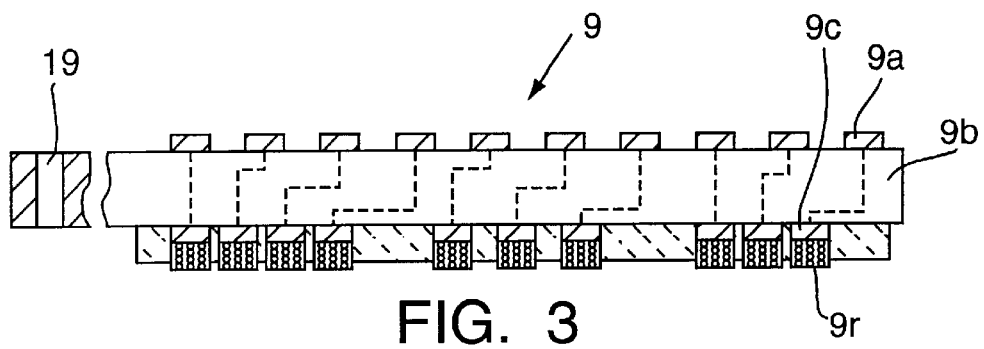
FIG. 3 is a cross-sectional view of a pitch conversion board.

Pitch conversion boards, such as the board 9, FIG. 3, are used for the inspection of circuit boards with pitches smaller than the inter-probe pitch of universal-type jigs, and are manufactured with a pattern that aligns with the pattern of corresponding printed circuit boards.

The pitch conversion board 9 has probe-side electrodes 9a and inspection-side electrodes 9c on a body 9b. Unevenly distributed PCR portions 9r are installed on the side of the inspection electrodes 9c. The pitch conversion board 9 also has a pair of first positioning holes 19 located at specified distances and in specified directions from the region in which the pattern of the inspection-side electrodes 9c are formed. In this embodiment, "Offgrit Adaptor JP2,000" manufactured by Japan Synthetic Rubber Inc. was used as the pitch conversion board 9.

Reverting now to FIG. 1, two cameras 11 are mounted on the bottom surface of upper base plate 21a so as to be coaxial with the first two positioning holes 19, respectively. A lower inspection jig 23 has a lower holding section 23b and guide means in the form of posts 8 on a lower base plate 23a. A positioning board or plate 7 is shown mounted on the guide posts 8 instead of a printed circuit board to be inspected.

Figure 2:
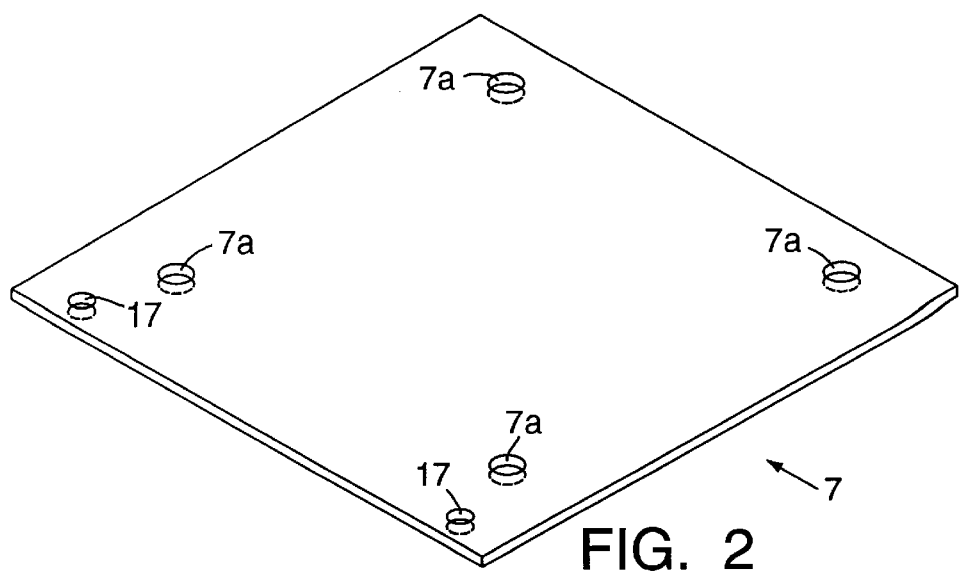
FIG. 2 is a perspective view showing a positioning plate.
Figure 6:
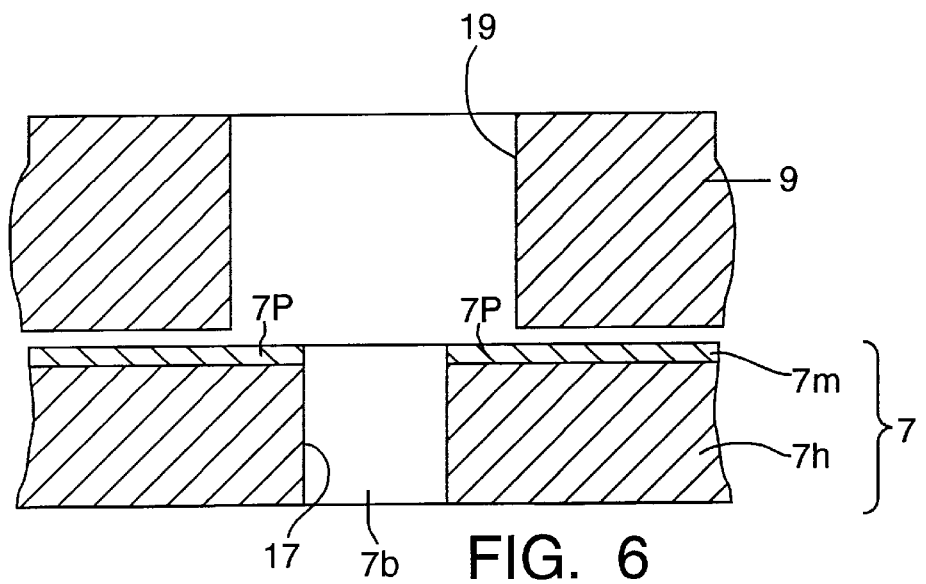
FIG. 6 shows a conversion board and positioning plate in engagement.

With reference to FIG. 2, positioning plate 7 is formed with guide holes 7a and a pair of second positioning holes 17. The guide holes 7a are of course formed at the same locations as that of the guide holes formed in the circuit board to be inspected. The area partially circumscribed or defined by the guide holes 7a corresponds to the region of a printed circuit board that is actually inspected, referred to as the inspection region hereinafter. The second positioning holes 17 are formed at specified distances and in specified directions from the inspection region. The positioning plate 7 may be made of a thin copper foil cover plate 7m and a plate body 7h as shown in FIG. 6.

The first positioning holes 19 have a larger diameter than the second positioning holes 17; the diameter of the first positioning holes 19 preferably being 1.2 to 3 times as large as that of the second positioning holes 17.

When single positioning holes are employed, it will be understood, however, that a non-circular hole cross sectional configuration is provided to enable correction for angular misalignment.

As will be apparent, the cameras 11 are placed outside of the region of the pitch conversion board 9 where the pattern of the inspection-side electrodes 9c is formed, and the first positioning holes 19 are formed on the pitch conversion board 9 coaxially with the optical axes of the cameras 11 respectively. In place of the printed circuit board, the positioning plate 7 is supported on the guide posts 8 on the lower inspection jig 23 as aforesaid, the second positioning holes 17 being formed at specified distances and in specified directions from the inspection region of the plate 7.

As also mentioned above, the lower inspection jig 23 is driven by lift 27 vertically toward and away from the upper jig as indicated by the arrow β.

Figure 4:
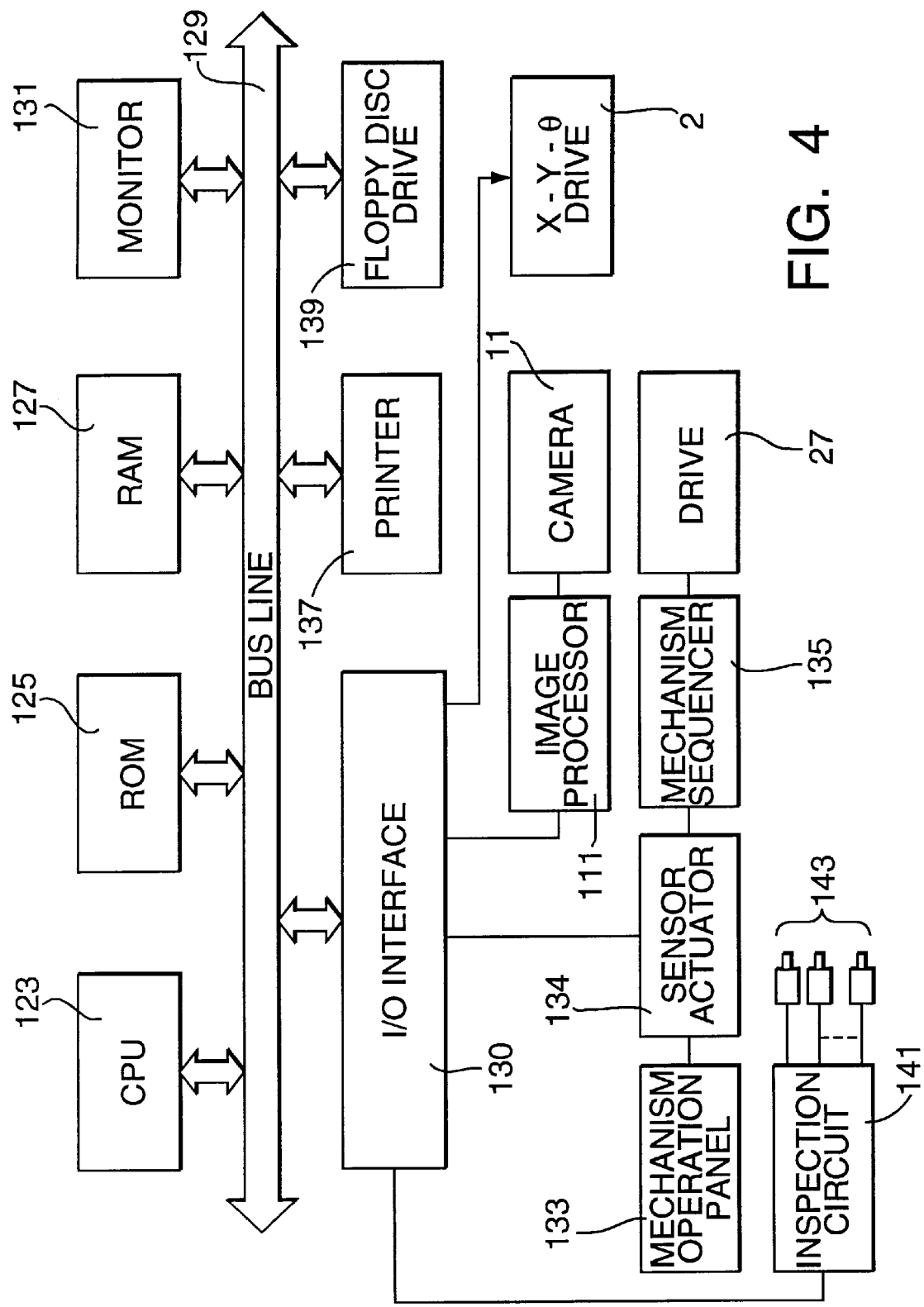
FIG. 4 is a block diagram of a control for a printed circuit board inspection apparatus.

FIG. 4 shows one example of control hardware for the printed circuit inspection apparatus of the present invention.

In FIG. 4, the control for the printed circuit board inspection apparatus comprises CPU 123, ROM 125, RAM 127, Monitor 131, FDD (floppy disk drive) 139, Printer 137, I/O Interface 130, and Bus Line 129. The CPU 123 controls operation via Bus Line 129 in accordance with a program stored in ROM 125. Monitor 131 displays the operating state of the apparatus and image data obtained by the Cameras 11. A floppy disc which stores data of preset conductivity of an inspected circuit board between Probes 143 is inserted in FDD 139. Printer 137 prints data indicating whether the detected conductivity of a circuit board between probes matches the preset conductivity data.

In addition to the foregoing, a Mechanism Sequencer 134, an Image Processor 111, and an Inspection Circuit 141 are connected to the I/O Interface 130. Mechanism Operation Panel 133 is connected to the Mechanism Sequencer 134. Lift 27 is also connected to Mechanism Sequencer 134 via Sensor Actuator 135. The Sensor Actuator 135 comprises a combination of a sensor which detects operation of the Drive 27 and an actuator 25 for operating the Drive. Image Processor 111 digitizes image data obtained by the Cameras 11.

Inspection Circuit 141 receives conductivity data from the Probes 143, processes the data and supplies the processed data to the CPU 123 via the I/O Interface 130. The data of detected conductivity are output to the Printer 137. The CPU 123 reads predetermined conductivity data for the printed circuit board to be inspected from the floppy disc in the FDD 139 and then compares predetermined data with detected data stored in RAM 127 and read by Inspection Circuit 141. Results of the inspection are then displayed by the Printer 137.

The method of the invention will now be described with reference to FIG. 5. Initially, the operator places positioning plate 7 on guide posts 8 (step ST1 in FIG. 5). The Mechanism Sequencer 134 then determines whether the switch on the Mechanism Operation Panel 133 has been pressed by the operator (step ST3). If so, Mechanism Sequencer 134 sends an elevation signal to the Sensor Actuator 135 (step ST5). The Sensor Actuator 135 operates the Lift 27 and detects a top-end signal when the Lift 27 has been driven to a specified position. The Mechanism Sequencer 134 determines whether a top-end detection signal has been sent by Sensor Actuator 135 (step ST7) and if not, continues the process of step ST5. If, at step ST7, a top-end detection signal is provided, a stop signal is output (step ST9). At this time, the positioning plate 7 engages the pitch conversion board 9.

Figure 5:
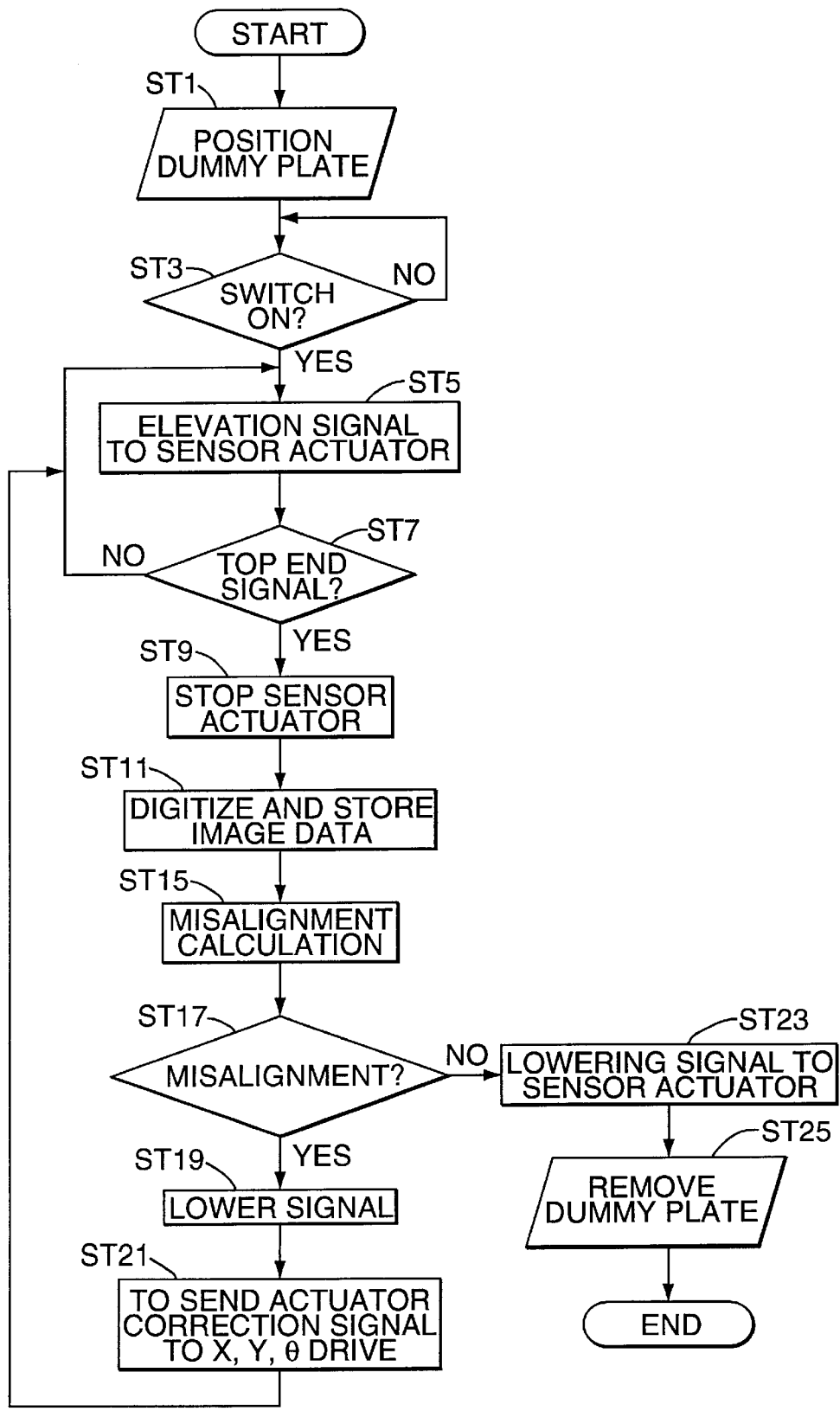
FIG. 5 is a flowchart of a process of a printed circuit board inspection apparatus.

The Image Processor 111 then digitizes image data from the Cameras 11, and the CPU 123 stores this data in RAM 127 (step ST11 in FIG. 5).

Figure 7:
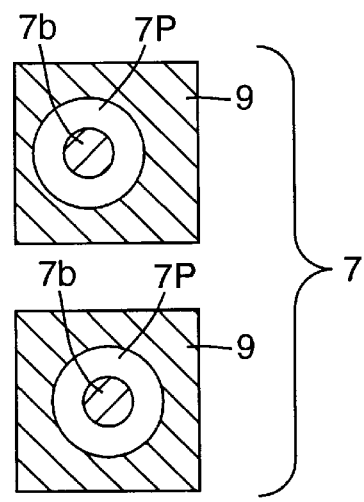
FIG. 7 shows images of first and second positioning holes as taken by a camera.

The image data obtained by the Cameras 11 at step ST11 will now be explained with reference to FIG. 6. As shown in FIG. 6, reflecting surface 7p has a hole of smaller diameter than that of the first positioning hole 19 and the surface of the positioning plate 7 is formed of copper foil plate 7m. Thus, light is reflected by the surface 7p to provide image data with dark holes, as shown in FIG. 7.

In FIG. 6, it will be noted that positioning plate 7 does not precisely abut the body of the pitch conversion board 9. This is because unevenly distributed PCR portions 9r protruding slightly from the pitch conversion board abut the copper foil plate 7m of the plate 7.

Figure 8:
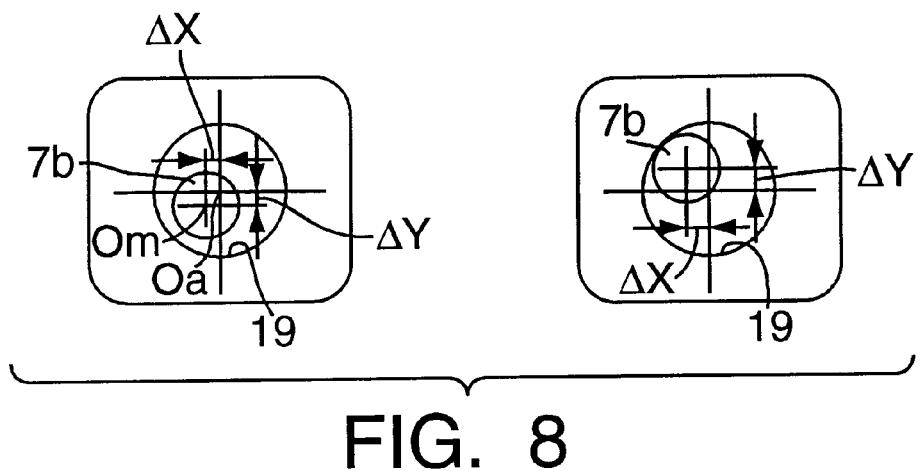
FIG. 8 shows examples of misalignments to be calculated.

As mentioned, the CPU 123 calculates the amount of misalignment based on digitized data stored in RAM 127 (step ST15 in FIG. 5). More specifically, the two second positioning holes 17 are detected by their respective cameras 11 to measure the deviation $\Delta X$ and $\Delta Y$ between the center Oa of a first positioning hole 19 and the center Om of a corresponding second positioning hole 17 in the directions of X and Y axes, respectively, as shown in FIG. 8. Based on the detected values, the amount of misalignment of the positioning plate 7 in the directions of the X and the Y axes and in an angular or rotational direction around a vertical axis can be calculated. Thus, the CPU 123 determines the kind and degree of misalignment between the plate 7 and the pitch conversion board 9 and sends a control signal commanding the Mechanism Sequencer 134 to transmit a lowering signal (step ST19 in FIG. 5). This releases the plate 7 and the pitch conversion board 9 from engagement.

The CPU 123 then transmits an appropriate signal to the X-Y-Ø drive 2 to horizontally displace the upper jig by an amount and in the direction required to correct the detected misalignment (step ST21). Thereafter, steps ST5 through ST15 may be repeated until at step ST17 it is detected that correction has been fully achieved and there is no remaining misalignment. The process then continues to step ST23 to output a control signal commanding the Mechanism Sequencer 134 to send a lowering signal. The lower inspection jig is retracted downwardly to release positioning plate 7 and the pitch conversion board 9 from engagement. The operator then removes the plate 7 (step ST25).

According to the present embodiment, the first positioning holes 19 are formed at specified distances and in specified directions from the probe region of the pitch conversion board 9 as mentioned, the cameras 11 are mounted such that their lens' are coaxial with the first positioning holes 19, and the second positioning holes 17 are also formed at specified distances and in specified directions from the inspection region of the plate 7, which is opposed to the probe region. Consequently, while the plate 7 and the pitch conversion board 9 are abutting each other, image data can be accurately read from the cameras 11 to calculate misalignment. The cameras 11 may also be somewhat removed from precise coaxial positions as long as they are able to photograph the first positioning holes 19.

Thus, according to the present embodiment, the cameras are located outside of the electrode region of the upper jig. As a result, even if the cameras cannot be installed inside the electrode region of the upper jig as in a printed board inspection apparatus with universal type jigs of the rubber type, the position of the upper inspection jig can be simply and accurately determined in an abutting state.

In addition, positioning of the upper jig may be made while an actual conductivity test is in progress in an abutting state. Errors are unlikely to occur and detection accuracy is high. The second positioning holes 17 in the positioning plate and the first positioning holes 19 are simultaneously detected in substantially the same plane and in substantially equivalent light reflecting conditions. The effect of errors in the accuracy of the mounting cameras is small and the adjusting operation is facilitated.

Although this embodiment has been described with reference to a rubber jig used as a pitch conversion board, it will be apparent that the invention is also applicable in the case where a spring probe is used.

Still further, the present invention is applicable where the printed board inspection apparatus includes an exclusive jig instead of a universal type jig and the cameras cannot be installed inside the exclusive jig (the electrode region of the upper jig).

Figure 10:
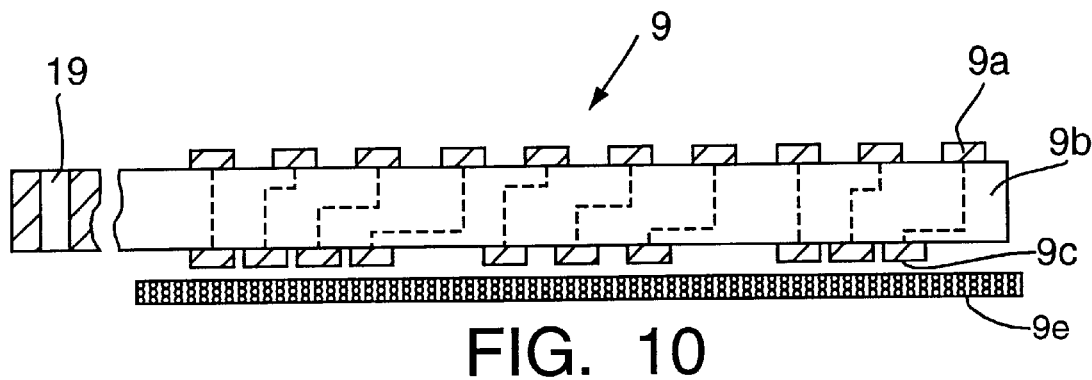
FIG. 10 shows another embodiment with a rubber jig.

Although the foregoing embodiment employed a pitch conversion board 9 shown in FIG. 3, a pitch conversion board 9 such as that shown in FIG. 10 may also be employed. An example of such a pitch conversion board is "Offgrit Adapter JP1,000" manufactured by Japan Synthetic Rubber Inc.

Figure 11:
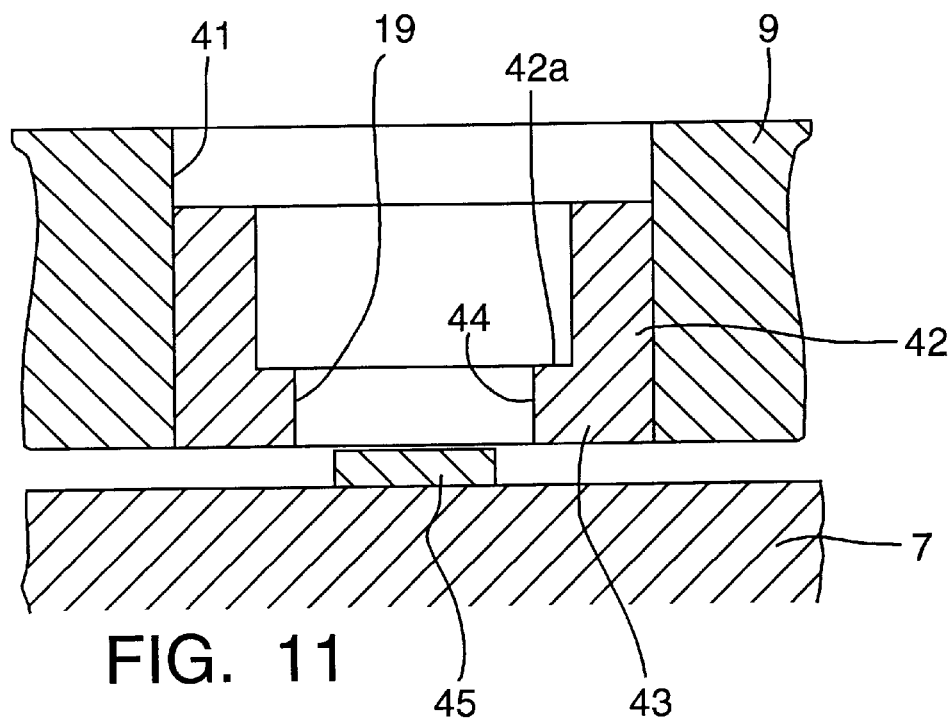
FIG. 11 shows another embodiment of a mark forming structure for detecting misalignment.

In addition, although the embodiment has been described wherein the second positioning holes 17 are formed on positioning plate 7 as positioning reference marks, instead, a reference mark such as 45 may be formed as a positioning plate reference mark with a bushing 42 embedded in the pitch conversion board 9, as shown in FIG. 11. In FIG. 11, a cylindrical through hole 41 is formed in the pitch conversion board 9 with a cup-like metallic (for example, stainless steel) bushing 42 fitted in the hole 41. The bushing 42 has a reference hole 44 formed in its bottom portion 43 which cooperates with the reference mark 45. The reference mark 45 may be formed in such a way that a glass-fiber mixed epoxy resin layer of the plate 7 may be exposed leaving the reference mark 45, or the reference mark 45 may be formed by printing a circle on a conductor (for example, copper or solder).

In this embodiment, when the lift 27 is elevated with plate 7 abutting a pitch conversion board, a digitized image is obtained in which the surfaces of shoulder or land 42a of bushing 42 and the reference mark 45 are bright, while the remaining parts are dark. Thus, the annular space between the outer circumference of reference mark 45 and the inner circumference of reference hole 44 is clearly visible. Black and white portions in this image are of course reversed from those in the image data of FIG. 7.

Still further, the upper jig reference marks took the form of through holes 19 in the foregoing embodiment. This construction, of course, facilities forming the image of the second positioning holes through the first positioning holes 19. Any of a wide variety of reference marks may be used, however, as long as misalignment between upper jig reference marks and positioning plate reference marks can be detected. For example, the pitch conversion board 9 may be composed of a transparent or semi-transparent material, and donut-like marks larger than corresponding positioning plate reference marks may be used as the upper-jig reference marks through which images of the positioning plate reference marks can be taken.

When the pitch conversion board 9 of FIG. 3 is used, misalignment may occur between the unevenly distributed PCR (Pressed Conductive Rubber) portions 9r and the body 9b. That is, after the probe-side electrodes 9a and the inspection-side electrodes 9c have been formed on the body 9b, the PCR portions 9r are formed on the electrode 9c.

Figure 12:
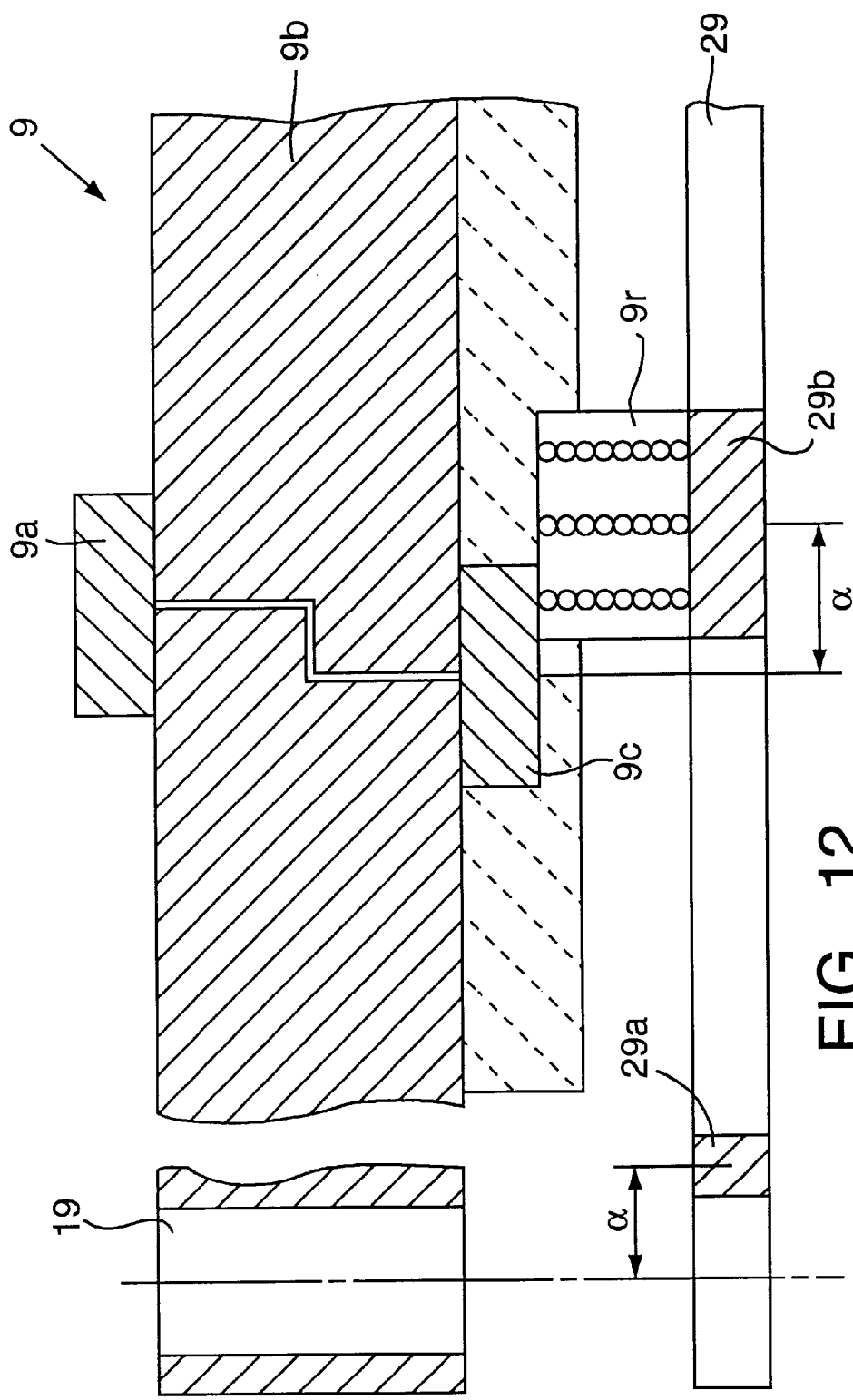
FIG. 12 illustrates the misalignment of unevenly distributed PCR (Pressed Conductive Rubber) portions.
Figure 13:
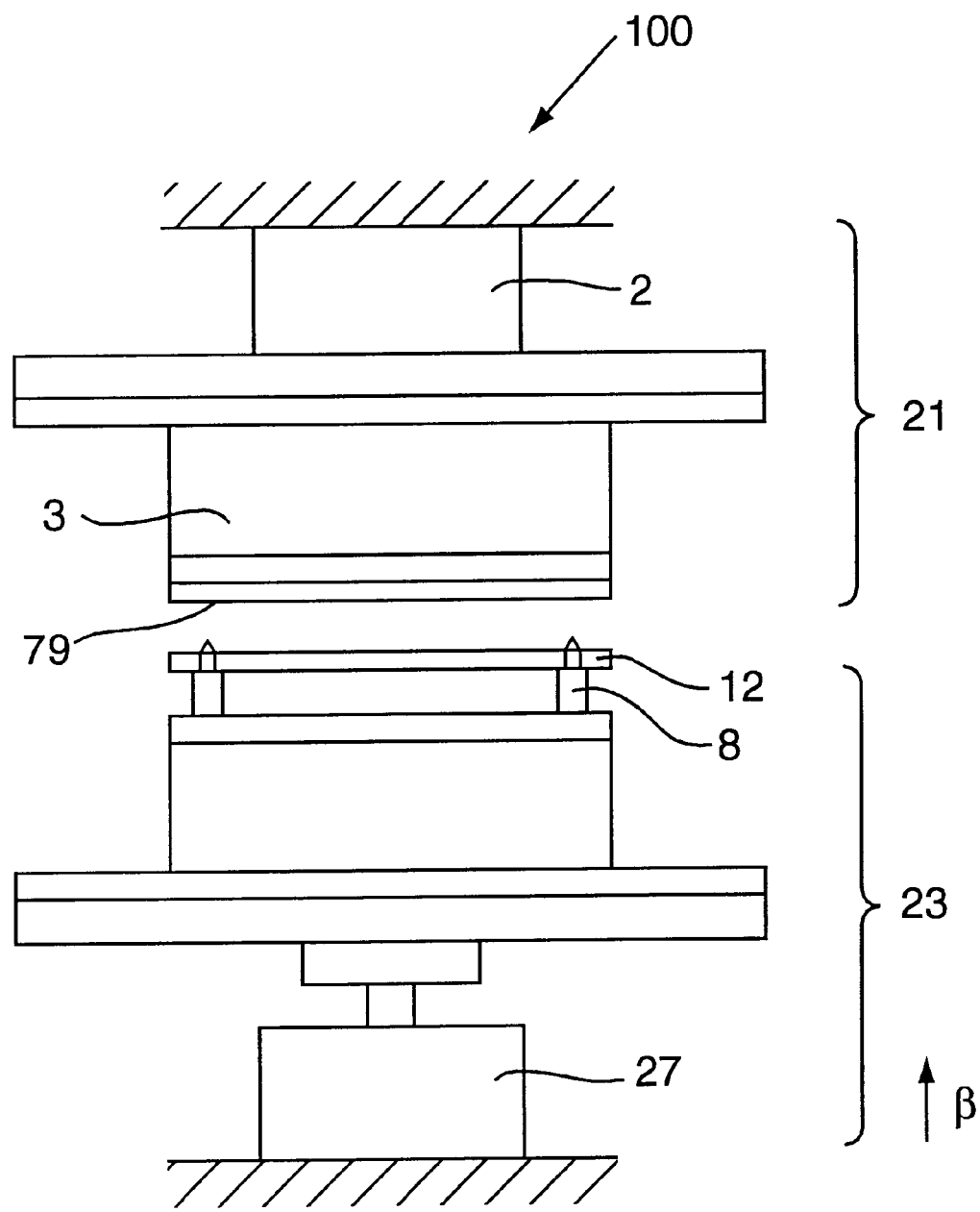
FIG. 13 shows a prior art printed circuit board inspection apparatus.

This problem can be solved by forming a reference mark 29a on a positive film 29, FIG. 12, used to form the unevenly distributed PCR portions 9r. The reference marks 29a are formed at the time of positive film forming, so as to have a predetermined relationship with the unevenly distributed PCR portions 9r.

The pattern portion 29b of the positive film 29 is temporarily adhered to the pitch conversion board 9 in such a way that the pattern portion 29b aligns with the pattern of the unevenly distributed PCR portions 9r. The pitch conversion board 9 is mounted on the universal jig 3, and the cameras 11 are used to photograph the first positioning holes 19 and the reference marks 29a in the positive film 29. The amount of misalignment between the first positioning holes 19 and the reference 29a on the positive film 29 is calculated and stored.

In this case, the inspection-side electrodes 9c on the body 9c and the first positioning holes 19 are in a predetermined relationship. In addition, the film reference marks 29a and the unevenly distributed PCR portions 9r are formed so as to have a predetermined relationship. If the unevenly distributed PCR portions 9r are offset from the inspection-side electrodes 9c by a distance α, the first positioning holes 19 are offset from the reference marks 29a by the distance α. Thus, misalignments occurring when the unevenly distributed PCR portions 9r are formed on the body 9b can be corrected with the misalignment α taken into consideration. The amount of misalignment α can be automatically corrected after positioning has been finished.

In the present embodiment, positive film 29 is used. Since the pattern portion of the positive film is dense while the remaining parts are transparent, it can be temporarily adhered easily with the pattern portion being aligned with the pattern of the unevenly distributed PCR portions 9r. The present invention is not limited, however, to positive film, and a negative film may be readily employed.

Further, in the above embodiments, the printed circuit board inspection apparatus automatically corrects the position of the upper inspection jig 3. The inspection apparatus may be constructed, however, such that, the operator manually corrects the position of the upper inspection jig, observing the monitor.

Figure 9:
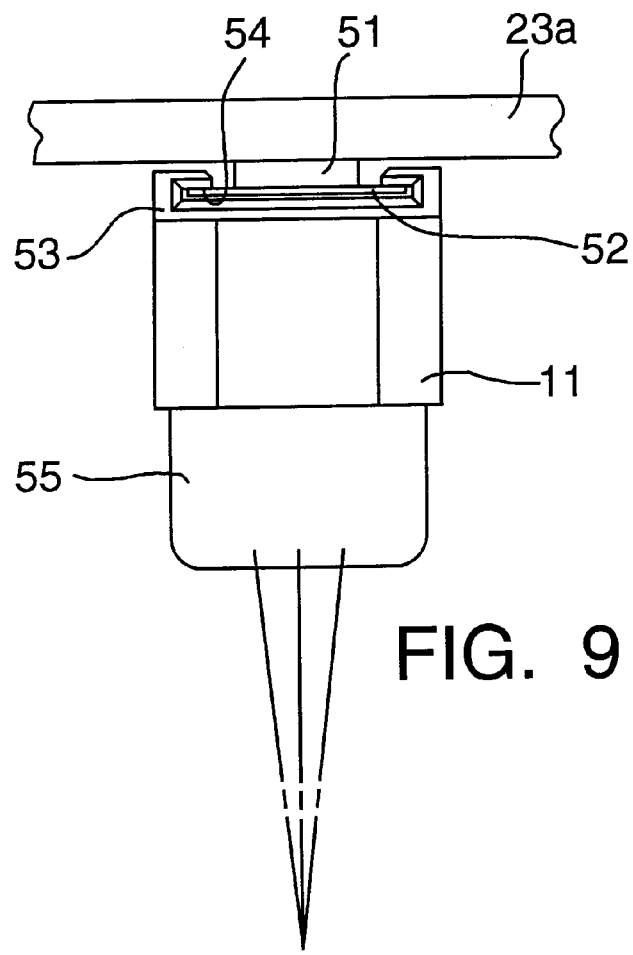
FIG. 9 shows a structure for mounting a camera.

The cameras 11 may also be fixed to the upper base plate 23a of the upper inspection jig 23 or may be removably mounted thereto, as shown in FIG. 9. In FIG. 9, a camera rail 52 is mounted on the upper base plate 23a via a rail spacer 51. A base 53 with a T-shaped groove 54 is formed on camera 11 and is engaged with the camera rail 52. A lighting device 55 may also be provided with a ring shape.

Finally, in the above-described embodiments, a Mechanism Sequencer 134 is used with a CPU in order to achieve the required functions. Alternatively, all functions may be performed by a CPU and its software or certain functions may be formed by hardware such as logic circuits.

Geometrical and spatial relationship terminology such as "upper", "lower", "horizontal", "vertical", etc., above and in the claims which follow is used for ease and convenience of description only and is not to be taken as limiting the scope of the invention in any sense.

I claim:

1. A printed circuit board inspection apparatus for inspecting electric conductivity between inspection points on a circuit pattern on a printed circuit board to be inspected, said apparatus comprising:

a substantially horizontally extending upper jig having an electrode region where a plurality of probes are arranged at universal pitches;

a pitch conversion board exchangeably mounted on said upper jig, said pitch conversion board having probe-side electrodes provided on the upper side of the board to be connected with the probes and inspection-side electrodes provided on the lower-side of the board to be brought into contact with the inspection points, said probe-side electrodes being arranged to adapt for the universal pitch of the probes of the upper jig, said inspection-side electrodes being connected with corresponding inspection points on the circuit pattern;

a first reference mark formed on said pitch conversion board;

a lower jig having guide means to support the printed circuit board at a position substantially horizontally thereon;

a removable reference plate held on the lower jig in place of the printed circuit board to be tested and having a second reference mark located at a specified position relative to a region corresponding to the inspecting region of the printed circuit board, said second reference mark being formed at a position to be aligned with the first reference mark when the pitch conversion board is at a matching position relative to the reference plate where the inspection-side electrodes align with the inspection points on the circuit board to be located in place of the reference plate;

a vertical drive means for causing relative movement of said upper and lower jigs to bring said reference plate into engagement with said pitch conversion board;

a horizontal drive means for causing relative movement of said upper and lower jigs in horizontal directions;

an image forming means associated with one of said jigs for forming overlapping images of said first and second reference marks when said reference plate is in engagement with said conversion board;

means for calculating the direction and amount of misalignment between said reference plate and said pitch conversion board based on the overlapping images formed by said image forming means; and control means for controlling the horizontal driving means in accordance with the output of said calculating means to bring said upper and lower jigs into the relative position to match the conversion board with the reference plate.

2. A printed circuit board inspection apparatus according to claim 1, wherein the image forming means is associated with said upper jig and is provided outside said electrode region of said upper jig and is directed downwardly from above said first reference mark.

3. A printed circuit board inspection apparatus according to claim 2, wherein said first reference mark is formed by a through hole, wherein said positioning plate has a surface of a high reflectance material, and wherein said second reference mark is formed by a through hole smaller than the through hole of said upper jig.

4. A printed circuit board inspection apparatus according to claim 1, wherein two first reference marks are provided on said pitch conversion board in said upper jig, and wherein said reference plate also has two second reference marks cooperating respectively with said two first reference marks on said pitch conversion board, wherein two image forming means are provided on one of said jigs, each image forming means forming overlapping images of each first reference mark and each second reference mark.

5. A printed circuit board inspection apparatus according to claim 1, wherein said pitch conversion board has an electrical conductive rubber portion which pattern is associated with the pattern of said printed circuit board to be inspected.

6. A method for horizontally positioning a pitch conversion board relative to a printed circuit board to be inspected, with a circuit board inspection apparatus for inspecting electric conductivity between inspection points on a circuit pattern on said printed circuit board, said apparatus including a substantially horizontally extending upper jig having an electrode region where a plurality of probes are arranged at universal pitches, and a lower jig having guide means for horizontally supporting said printed circuit board, and an image forming means associated with one of said jigs, the method comprising the steps of:

mounting a pitch conversion board on said upper jig, said pitch conversion board having probe-side electrodes provided on the upper side of the board to be connected with the probes and inspection-side electrodes provided on the lower-side of the board to be brought into contact with the inspection points, said probe-side electrodes being arranged to adapt for the universal pitch of the probes of the upper jig, said inspection-side electrodes being connected with corresponding inspection points, said pitch conversion board having a first reference mark at a position enabling image formation by said image forming means;

mounting a reference plate on the lower jig guide means at the location where a printed circuit board is to be mounted, said reference plate having a second reference mark at a position corresponding to said first reference mark;

driving one of said jigs vertically to bring said pitch conversion board and said reference plate into engagement with each other;

taking overlapping images of said first reference mark and said second reference mark while said pitch conversion board and reference plate are in engagement;

calculating the amount and direction of the misalignment between said reference plate and said pitch conversion board based on the overlapping images taken; and adjusting the relative horizontal position of said lower and upper jigs based on the results of the calculation to match the inspection-side electrodes with corresponding inspection points.

7. A pitch conversion board positioning method according to claim 6, wherein the image forming means is associated with said upper jig and is provided outside said electrode region of said upper jig and is directed downwardly from above said first reference mark.

8. A pitch conversion board positioning method according to claim 6, wherein the first reference marks are provided on said pitch conversion board in said upper jig, and wherein said reference plate also has two second reference marks cooperating respectively with said two first reference marks on said pitch conversion board, wherein two image forming means are provided on one of said jigs, each image forming means forming overlapping images of each first reference mark and each second reference mark.

9. A pitch conversion board positioning method according to claim 6, wherein said pitch conversion board has an electrical conductive rubber portion which is formed a pattern associated with the pattern of said printed circuit board to be inspected.

10. A pitch conversion board positioning method according to claim 9, wherein: said electrically conductive rubber portion of said pitch conversion board is at a position corresponding to the electrodes of said pitch conversion board, and the step of calculating the misalignment comprises the steps of:

providing pattern-reference marks on a film with which said conductive rubber portion is formed in a pattern, the pattern-reference marks being located with reference to the patterns;

placing said film in such a way that the pattern of the film aligns with the pattern of the conductive rubber portion; and photographing said pattern-reference marks and said first reference marks and measuring misalignment of the marks.

* * * * *